United States Patent [19]

Greene et al.

[11] 4,224,520
[45] Sep. 23, 1980

[54] ROOM TEMPERATURE TWO COLOR INFRARED DETECTOR

[75] Inventors: Richard F. Greene, Bethesda; Kurt P. Scharnhorst, Columbia, both of Md.

[73] Assignee: The United States of America as represented by the Secretary of the Navy, Washington, D.C.

[21] Appl. No.: 57,612

[22] Filed: Jul. 13, 1979

[51] Int. Cl.$^2$ ............................................. G01J 1/00
[52] U.S. Cl. .................................... 250/338; 338/18; 357/30
[58] Field of Search .............. 250/338, 340, 370, 371; 357/30, 29; 338/15, 18

[56] References Cited

U.S. PATENT DOCUMENTS

| | | | |
|---|---|---|---|
| 3,740,690 | 6/1973 | Scharnhorst | 338/18 |
| 3,743,995 | 7/1973 | Riedl et al. | 338/18 |
| 3,831,029 | 8/1974 | Jones et al. | 250/338 |
| 3,898,605 | 8/1975 | Burns | 338/18 |
| 4,001,586 | 1/1977 | Fraioli | 250/338 |
| 4,029,962 | 6/1977 | Chapman | 250/338 |
| 4,060,729 | 11/1977 | Byer et al. | 250/338 |
| 4,115,692 | 9/1978 | Balcerak et al. | 250/338 |

Primary Examiner—Davis L. Willis
Attorney, Agent, or Firm—R. S. Sciascia; A. L. Branning; R. E. Bushnell

[57] ABSTRACT

An amorphous film (44) of a photoresponsive semi-conducting material such as germanium-telluride deposited upon a thick silicon dioxide layer (40) formed on a silicon chip substrate (38). The silicon chip (38) underlying the central region of the amorphous film (44) is etched through to the silicon dioxide layer (40) to define a trough (48) thermally isolating the central region of the silicon dioxide layer (40).

5 Claims, 6 Drawing Figures

ROOM TEMPERATURE TWO COLOR INFRARED DETECTOR

DESCRIPTION

Technical Field

This invention relates to photosensitive semiconducting devices and the processes for making them and more particularly, to infrared detectors and bolometers.

BACKGROUND ART

An earlier version of a semiconducting device able to detect and distinguish between impingent radiation in the visible to three micron and three to twelve micron wavelength bands is disclosed in U.S. Pat. No. 3,743,995. A similar device capable of detecting impingent radiation in the eight to fourteen micron band is disclosed in U.S. Pat. No. 3,740,690. Both of those devices use an amorphous film of a semiconducting material that is vapor deposited upon a silicon oxide (silicon-oxygen) based glass (e.g., Corning No. 2950 glass) substrate in order to use the molecular resonance-vibration-absorption of the silicon-oxygen bond of the glass to detect radiation in the three to twelve micron band. The glass substrate is affixed in a support with cement.

DISCLOSURE OF INVENTION

A simplified monolithic semiconductor cell exhibiting distinguishable photoresponsivities over two discrete spectral bands. A silicon chip serves as a substrate while a self-supporting, thick silicon-dioxide layer that is thermally grown in a vacuum on one surface of the substrate provides a bolometric response to impingent radiation over the eight to fourteen micron band. An amorphous germanium-telluride film deposited on the silicon-dioxide layer provides a photo-conductive response over the visible to 3.5 micron band. A trough, preferentially etched through the substrate directly under the amorphous film prevents the substrate from thermally shorting the silicon-dioxide layer. Ohmic contacts electrically couple the amorphous film to ancillary signal processing circuitry. This structure facilitates fabrication by eliminating the necessity of handling a fragile silicon oxide based glass substrate. Conventional silicon art techniques may be used to grow the silicon-dioxide layer and etch the trough into the substrate. Conventional vacuum deposition techniques may be used to deposit the amorphous semiconductor film and then add the ohmic contacts to the cell. Additionally, ancillary electronic circuitry may be disposed on the silicon substrate.

Accordingly, it is an object of this invention to provide a device to detect electromagnetic radiation in two distinct spectral regions.

It is a second object to provide a device giving a distinguishable response to each of two discrete spectral regions.

It is another object to provide a device giving distinguishable responses to two colors that is susceptable to manufacture by conventional silicon processing techniques.

It is yet another object to provide a two color infrared detector that can be readily manufactured with micro-electronic and large scale integrated circuit techniques as arrays integrated with ancillary signal processing devices.

It is still another object to provide a process for manufacturing silicon semiconductor infrared detectors.

BRIEF DESCRIPTION OF THE DRAWINGS

A more complete appreciation of this invention and the many attendant advantages thereof will be readily enjoyed as the same becomes better understood by reference to the details of the following description when considered in conjunction with the accompanying drawings in which like numbers indicate the same or similar components, wherein.

BEST MODE FOR CARRYING OUT THE INVENTION

Figure 1:
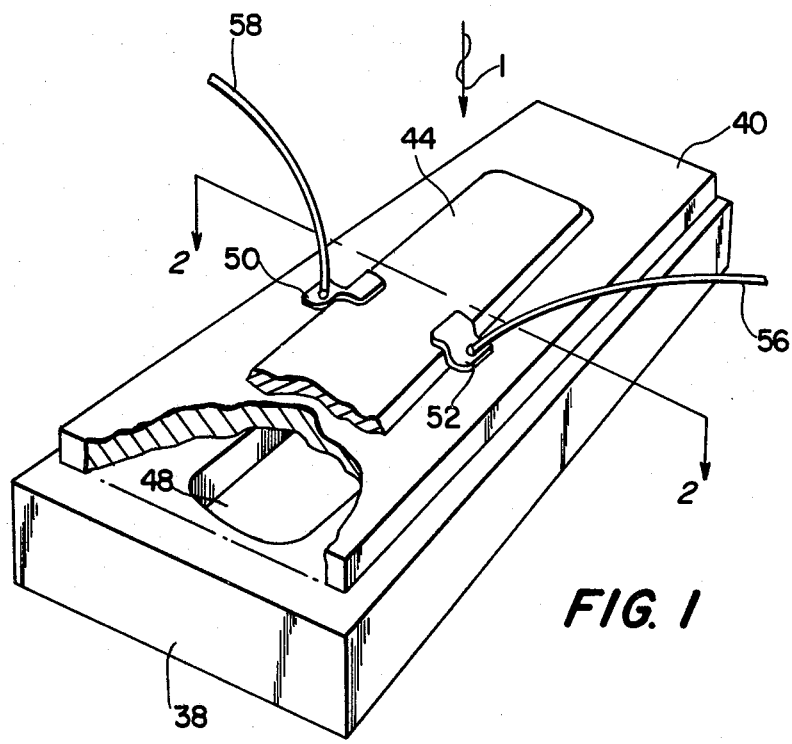
FIG. 1 is an orthogonal projection of a partially cut-away photoresponsive cell made according to these teachings.

Refer now to the drawings, and in particular to FIG. 1 where an orthogonal view illustrates one embodiment of a two color infrared detector. A standard, commercially available silicon substrate (i.e., a silicon "chip") 38 serves as a substrate for the detector. After growth, substrate 38 is coated all over with a one to two micron thick layer of silicondioxide (i.e., SiO) by heating substrate 38 to a temperature of about one thousand degrees celsius in the presence of oxygen. In practice, it is most likely that instead of coating substrate 40 all over, only the single layer 40 shown is thermally grown on the desired face of substrate 38. A commercially available fluoride solution for preferentially etching (i.e., an etchant that is isotropic in silicon) along the crystal axis is applied to a small, central area on the surface of substrate 38 opposite layer 40. The solution is neutralized when a cavity 48 is etched that extends completely through substrate 38 to the adjoining layer 40 of silicon dioxide. Cavity 48 is preferentially about one micron wide. The substrate is cleaned and put into a vacuum deposition furnace where an amorphous film 44 of germanium-telluride several thousand angstrom units thick is disposed upon the part of the silicon-dioxide layer 40 centered over cavity 48. Ideally, the thickness of amorphous film 44 is controlled in order to minimize reflectivity over the short wavelength band centered on 1.6 microns. After substrate 38 is cooled, ohmic contacts 50, 52 of a suitable metal such as aluminum or lead are sputtered or vaporized onto opposite sides of amorphous film 44 while substrate 38 is held in situ. Contacts 50, 52, although each shown as extending between the opposite edges of film 44 and the adjoining surface of layer 40, need not touch layer 40. Electrical leads 56, 58 may be attached to the contacts 52, 50, respectively, by a compression bond or with silver paint. The completed device is mounted in a holder; a space filter of some type (e.g., a reticle or scanner, neither of which is shown) is then positioned between the device and incident electromagnetic radiation 1.

Figure 2:
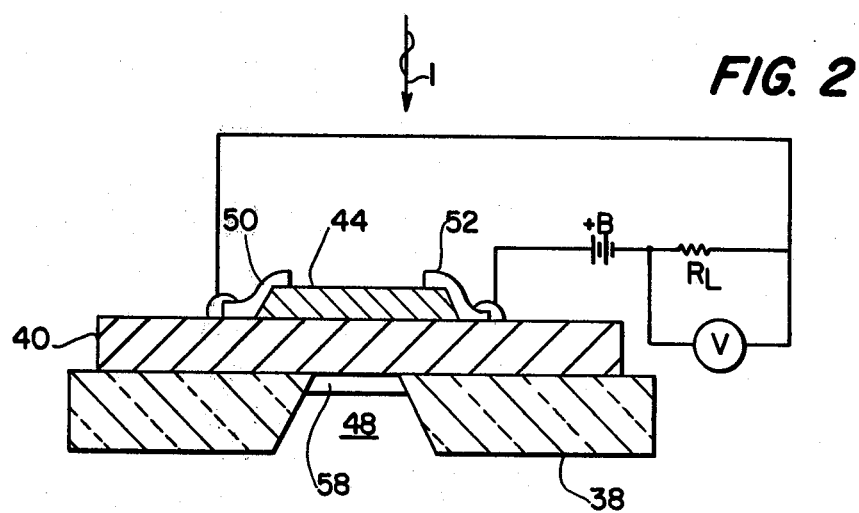
FIG. 2 is a front cross-sectional view of the cell shown in FIG. 1.

FIG. 2 presents a front cross-sectional view of the device shown in FIG. 1 with the associated detection circuit coupled across silicon-dioxide layer 40. Silicon dioxide layer 40 serves two functions. First, it supports amorphous film 44 and second, it develops heat from impingent radiation and transmits the heat to film 44. In an alternative to the structure shown in FIG. 1, a very thin (e.g., 0.01 microns thick) film 58 of a metal such as aluminum may be applied to the one micron wide surface of silicon dioxide layer 40 exposed by creation of cavity 48 in order to increase photosensitivity by reflecting radiation back into layer 40. If the thickness of film 58 exceeds 0.05 microns however, there is a possibility that film 58 will act as a thermal short circuit of silicon dioxide layer 40.

Figure 3:
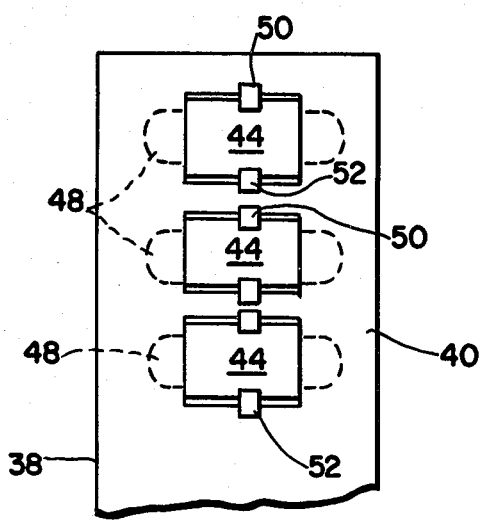
FIG. 3 is a top view of a multi-cell device made according to these teachings.

FIG. 3 is a top view of a multi-cell device. A silicon-dioxide layer 40 is formed on one surface of a silicon substrate 38. Three cavities 48 are preferentially etched through substrate 38 to the silicon-dioxide layer 40. Three discrete amorphous films of stoichiometric germanium-telluride are grown on the silicon-dioxide layer, each straddling a different one of cavities 48. Pairs of electrical contacts 50, 52 are deposited on opposite edges of the amorphous films 44.

Figure 4:
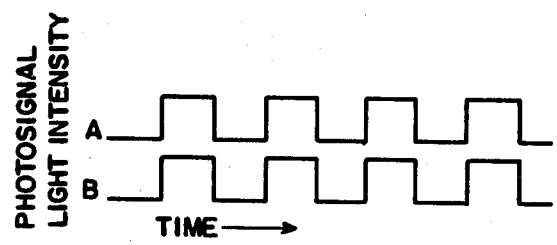
FIGS. 4B, 5, and 6 are two coordinate diagrams showing of the type of temporal response curves obtained when electromagnetic radiation potentially incident on the device is spatially filtered in the sequence shown in FIG. 4A.
Figure 5:
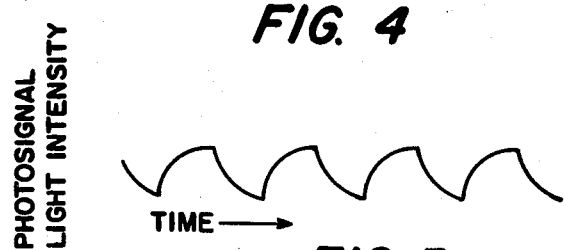
Figure 6:
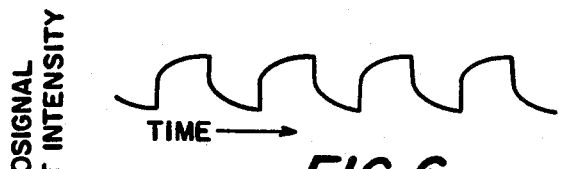

As explained in U.S. Pat. No. 3,743,995, FIG. 4B is a two coordinate graph of the type of temporal response curve obtained from the intrinisic band-to-band photoresponse of a single semiconducting amorphous film 44 if incident radiation were chopped by a space filter so as to produce the square pulses of radiation shown in FIG. 4A. The two coordinate graph of FIG. 5 illustrates the type of response cure obtained from the bolometric effect resulting from radiation induced heating of the silicon-dioxide layer 40 by the chopped square pulses of impingment electro-magnetic radiation shown in FIG. 4A. As the semiconducting material of amorphous film 44 in the particular embodiment described here is chosen to be rather transparent to impingent radiation longer than four microns in wavelength, the longer wavelength radiation is transmitted through film 44 and into silicon-dioxide layer 40. Silicon-dioxide, the long wavelength absorber forming layer 40 is heated by the longer wavelength radiation, and in turn heats amorphous film 44, causing the electrical response shown in FIG. 5. As the bolometric effect curve, FIG. 5, exhibits a longer rise time at the same voltage, +B, for the same amplitude of photosignal light intensity than the photoresponse curve, FIG. 4B, it is a simple matter to electronically distinguish between them and thereby identify which spectra is incident upon the device. FIG. 6 is a two coordinate graph illustrating the type of response curve obtained when both the intrinsic effect and the bolometric effect simultaneously occur in response to incident electromagnetic radiation 1 chopped as shown in FIG. 4A. Again the shape of the response curve provides a method for electronically distinguishing between incident radiation over both the shorter and longer wavelength spectra from incident radiation in either one of the spectra.

Silicon is used as the material of substrate 38 for two reasons. First, the art of growing oxides upon silicon is well developed and provides a tough, monolithic structure. Second, the contemporary solid state microelectronic art for making analogue and digital signal processing circuits is based upon the interface between silicon and a silicon-oxide, that is $Si-SiO_x$. As infrared detectors always require ancilliary signal processing circuits, the present invention is no exception; some $Si-SiO_x$ structure will ultimately be used in association with the presently disclosed detector. The presently disclosed detector, uses an amorphous germaniumtelluride film 44 to provide photoresponsivity at 1.6 microns. Incorporation of a $Si-SiO_x$ interface into its structure as an operative element that in conjunction with amorphous film 44 provides photoresponsivity at ten microns, facilitates association of the detector with ancilliary signal processing circuiting. Accordingly, the detector may be manufactured simultaneously with the signal processing circuitry as integrated components of a single, monolithic device.

While a silicon dioxide layer 44 may be deposited rather than thermally grown, on any electrically insulating substrate by such processes as precipitating silane and oxygen. A grown oxide adheres to the substrate better and is more reproducible than a deposited oxide layer. A monolithic structure with the adherence that the presently disclosed detector provides between grown oxide layer 44 and substrate 38 has a superior ability to withstand large forces of gravity such as those experienced by the guidance system of a missile.

We claim:

1. A detector of electromagnetic radiation having a amorphous film of a semiconducting material transparent to a first spectrum disposed about a substrate having a pair of opposed major surfaces, with a pair of electrical contacts oppositely arranged about the film, characterized by:

the substrate being a silicon chip;
a layer of silicon-dioxide formed upon one of the surfaces positioned between the substrate and the amorphous film to absorb radiation in the first spectrum;
a cavity in the substrate centered under the amorphous film, extending between the opposed major surfaces to the layer of silicon-dioxide; and
a pair of electrical contacts oppositely disposed about the film and across the cavity.

2. A detector of electromagnetic radiation, comprising:

a silicon substrate;
a layer of silicon-dioxide formed upon the substrate, for absorption of radiation in a fist spectrum;
a cavity in the substrate adjoining a central area of the layer;
an amorphous film of a semiconducting material transparent to radiation in the first spectrum, disposed upon the layer over the cavity; and
a pair of electrical contacts oppositely disposed about the film across the cavity.

3. The detector set forth in claims 1 or 2 wherein the layer is grown upon the substrate by heating the substrate in a vacuum to a temperature of about one thousand degrees celsius.

4. The detector set forth in claim 3 further comprised of a thin film of metal being disposed in the cavity upon the layer.

5. The detector set forth in claim 3 wherein the semiconducting material consists essentially of amorphous germanium telluride.

* * * * *